(12) United States Patent
Gama et al.

(10) Patent No.: US 11,970,769 B2
(45) Date of Patent: Apr. 30, 2024

(54) CYCLICAL DEPOSITION METHODS

(71) Applicant: ASM IP Holding B.V., Almere (NL)

(72) Inventors: Trigagema Gama, Hwaseong-si (KR); Ryu Nakano, Sagamihara (JP)

(73) Assignee: ASM IP Holding B.V., Almere (NL)

(*) Notice: Subject to any disclaimer, the term of this patent is extended or adjusted under 35 U.S.C. 154(b) by 0 days.

(21) Appl. No.: 17/845,150

(22) Filed: Jun. 21, 2022

(65) Prior Publication Data

US 2023/0017874 A1 Jan. 19, 2023

Related U.S. Application Data

(60) Provisional application No. 63/214,394, filed on Jun. 24, 2021.

(51) Int. Cl.
*C23C 16/40* (2006.01)
*C23C 16/455* (2006.01)
*C23C 16/458* (2006.01)
*C23C 16/56* (2006.01)

(52) U.S. Cl.
CPC ...... *C23C 16/402* (2013.01); *C23C 16/45527* (2013.01); *C23C 16/45553* (2013.01); *C23C 16/4583* (2013.01); *C23C 16/56* (2013.01)

(58) Field of Classification Search
CPC ............ C23C 16/402; C23C 16/45527; C23C 16/45553; C23C 16/4583
See application file for complete search history.

(56) References Cited

U.S. PATENT DOCUMENTS

| 7,678,422 | B2* | 3/2010 | Lei | C23C 16/45553 |
| | | | | 117/88 |
| 7,943,531 | B2* | 5/2011 | Nemani | H01L 21/02216 |
| | | | | 438/789 |
| 9,284,642 | B2* | 3/2016 | Nakano | C23C 16/405 |
| 2008/0020593 | A1* | 1/2008 | Wang | C23C 16/45531 |
| | | | | 438/782 |
| 2011/0215445 | A1* | 9/2011 | Yang | B01J 19/00 |
| | | | | 524/588 |
| 2012/0196451 | A1* | 8/2012 | Mallick | C23C 16/56 |
| | | | | 257/E21.24 |
| 2012/0202359 | A1 | 8/2012 | Hill | |

(Continued)

FOREIGN PATENT DOCUMENTS

WO WO 2012033717 A2 * 3/2013 ............. C23C 16/42

OTHER PUBLICATIONS

Murray, Ciaran, et al., "The Effect of Reaction Mechanism on Precursor Exposure Time in Atomic Layer Deposition of Silicon Oxide and Silicon Nitride". Chemistry of Materials, ACS Applied Materials & Interfaces, 6, 2014, 10534-10541.*

(Continued)

*Primary Examiner* — Bret P Chen
(74) *Attorney, Agent, or Firm* — Snell & Wilmer L.L.P.

(57) ABSTRACT

Methods and systems for depositing a layer comprising silicon oxide on the substrate are disclosed. Exemplary methods include cyclical deposition methods that include providing a first silicon precursor to the reaction chamber, providing a second silicon precursor, and using a reactant or a non-reactant gas forming silicon oxide on a surface of the substrate. Exemplary methods can further include a treatment step.

19 Claims, 12 Drawing Sheets

(56) References Cited

U.S. PATENT DOCUMENTS

| | | | | |
|---|---|---|---|---|
| 2013/0115763 A1* | 5/2013 | Takamure | ......... | H01L 21/02274 438/513 |
| 2014/0134812 A1* | 5/2014 | Kim | ................. | H01L 21/28194 438/270 |
| 2015/0004806 A1* | 1/2015 | Ndiege | ............ | H01L 21/02274 438/789 |
| 2016/0083847 A1* | 3/2016 | Spence | ................ | C07F 7/1888 546/14 |
| 2019/0055645 A1* | 2/2019 | Li | ..................... | H01L 21/02219 |
| 2019/0249303 A1* | 8/2019 | Kuroda | ................ | C23C 16/402 |
| 2020/0010954 A1 | 1/2020 | Bhuyan | | |
| 2020/0373149 A1* | 11/2020 | Park | ................. | H01L 21/02301 |
| 2022/0350248 A1* | 11/2022 | Liu | .................... | H01L 21/0228 |

OTHER PUBLICATIONS

Park, Jae-Min, et al., "Novel Cyclosilazane-Type Silicon Precursor and Two-Step Plasma for Plasma-Enhanced Atomic Layer Deposition of Silicon Nitride". ACS Applied Materials & Interfaces, 2018, 10, 9155-9163.*

Ovanesyan, Rafaiel A., et al., "Atomic layer deposition of silicon-based dielectrics for semiconductor manufacturing: Current status and future outlook". Journal of Vacuum Science & Technology A 37(6), Nov./Dec. 2019, 060904 pp. 1-22.*

Mallikarjunan, Anupama, et al., "Designing high performance precursors for atomic layer deposition of silicon oxide". Journal of Vacuum Science and Technology A 33 (1), Jan./Feb. 2015, 01A137, pp. 1-4.*

Lee, Joo-Hyeon, et al., "Investigation of Silicon Oxide Thin Films Prepared by Atomic Layer Deposition Using SiH2Cl2 and O3 as the Precursors". Japanese Journal of Applied Physics, vol. 43, No. 3A, 2004, pp. L328-L330.*

Kim, Dae Hyun, et al., "Thermal Atomic Layer Deposition of Device-Quality SiO2 Thin Films under 100° C. Using an Aminodisilane Precursor". Chemistry of Materials, 2019, 31, 5502-5508.*

Nam, Taewook, et al., "Low-temperature, high-growth-rate ALD of SiO2 using aminodisilane precursor". Applied Surface Science 485 (2019) 381-390.*

* cited by examiner

CYCLICAL DEPOSITION METHODS

CROSS-REFERENCE TO RELATED APPLICATIONS

This application claims priority to U.S. Provisional Patent Application Ser. No. 63/214,394 filed Jun. 24, 2021, titled CYCLICAL DEPOSITION METHODS AND STRUCTURES FORMED USING THE METHODS, the disclosure of which is hereby incorporated by reference in its entirety.

FIELD OF INVENTION

The present disclosure generally relates to methods and systems suitable for the manufacture of electronic devices. Examples of the disclosure relate to methods and systems for depositing silicon oxide using a cyclical deposition process.

BACKGROUND OF THE DISCLOSURE

During the manufacture of electronic devices, deposition of silicon oxide is desirable for several applications, including, for example, insulation and isolation of device components. In some cases, silicon oxide is deposited using chemical vapor deposition (CVD). While CVD can work well for several applications, silicon oxide films or layers that are deposited using CVD are typically not conformal. Generally, as device size decreases, the demand for controlling a film thickness more precisely—e.g., by deposition of conformal films—increases.

Atomic layer deposition (ALD) can be used to form a thin film on a substrate layer-by-layer by supplying different process gases sequentially and alternately. ALD can enable one to control deposited film thickness more precisely, compared to a thickness of films deposited using conventional CVD techniques. While ALD can generally meet the demand for precise control of conformal film deposition, ALD suffers from relatively low film deposition rate, compared to CVD. The low deposition rate, in turn, leads to low throughput. The low throughput can lead to relatively expensive device processing. Therefore, improved methods of depositing conformal silicon oxide layers with a deposition rate greater than typical ALD rates are desired.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

Various embodiments of the present disclosure relate to methods of forming structures that include silicon oxide layers. While the ways in which various embodiments of the present disclosure address drawbacks of prior methods and systems are discussed in more detail below, in general, exemplary embodiments of the disclosure provide improved methods and systems that include the use of two or more silicon precursors that react with each other to increase a deposition rate of a layer of silicon oxide.

In accordance with an embodiment of the disclosure, a cyclical method includes providing a substrate within a reaction chamber and depositing a layer comprising silicon oxide on the substrate, wherein a deposition cycle includes: providing a first silicon precursor to the reaction chamber, providing a second silicon precursor, and providing a reactant. The first silicon precursor can include two or more ligands independently selected from the group consisting of —$NR_2$ ligands; the second silicon precursor can include at least one independently selected —OR ligand. Each R in each ligand can be independently selected. Examples of R for each —$NR_2$ ligand and for —OR ligands are provided below.

In accordance with further examples of the disclosure, a method includes providing a first silicon precursor to the reaction chamber, providing a second silicon precursor, and providing a non-reactant active species, wherein the first silicon precursor comprises two or more ligands independently selected from the group consisting of —$NR_2$ ligands, and wherein the second silicon precursor comprises two or more ligands independently selected from the group consisting of —OR ligands. The $NR_2$ and/or the —OR ligands can include such ligands as described elsewhere herein.

In accordance with various examples of the disclosure, a method can further include a step of treating deposited silicon oxide. For example, the method can include repeating a deposition cycle one or more times, and after the step of repeating, performing an (e.g., oxygen plasma) treatment step. A number of deposition cycles can desirably be larger than a number of treatment steps.

As described in more detail below, use of the two silicon precursors allows for a relatively high deposition rate—compared to traditional atomic layer deposition process. Methods described herein also provide for precise thickness control that is typically associated with atomic layer deposition.

A structure may be formed according to a method as disclosed herein.

In accordance with further examples, a system is provided. The system can be configured to perform a method as disclosed herein.

These and other embodiments will become readily apparent to those skilled in the art from the following detailed description of certain embodiments having reference to the attached figures; the disclosure not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 4:
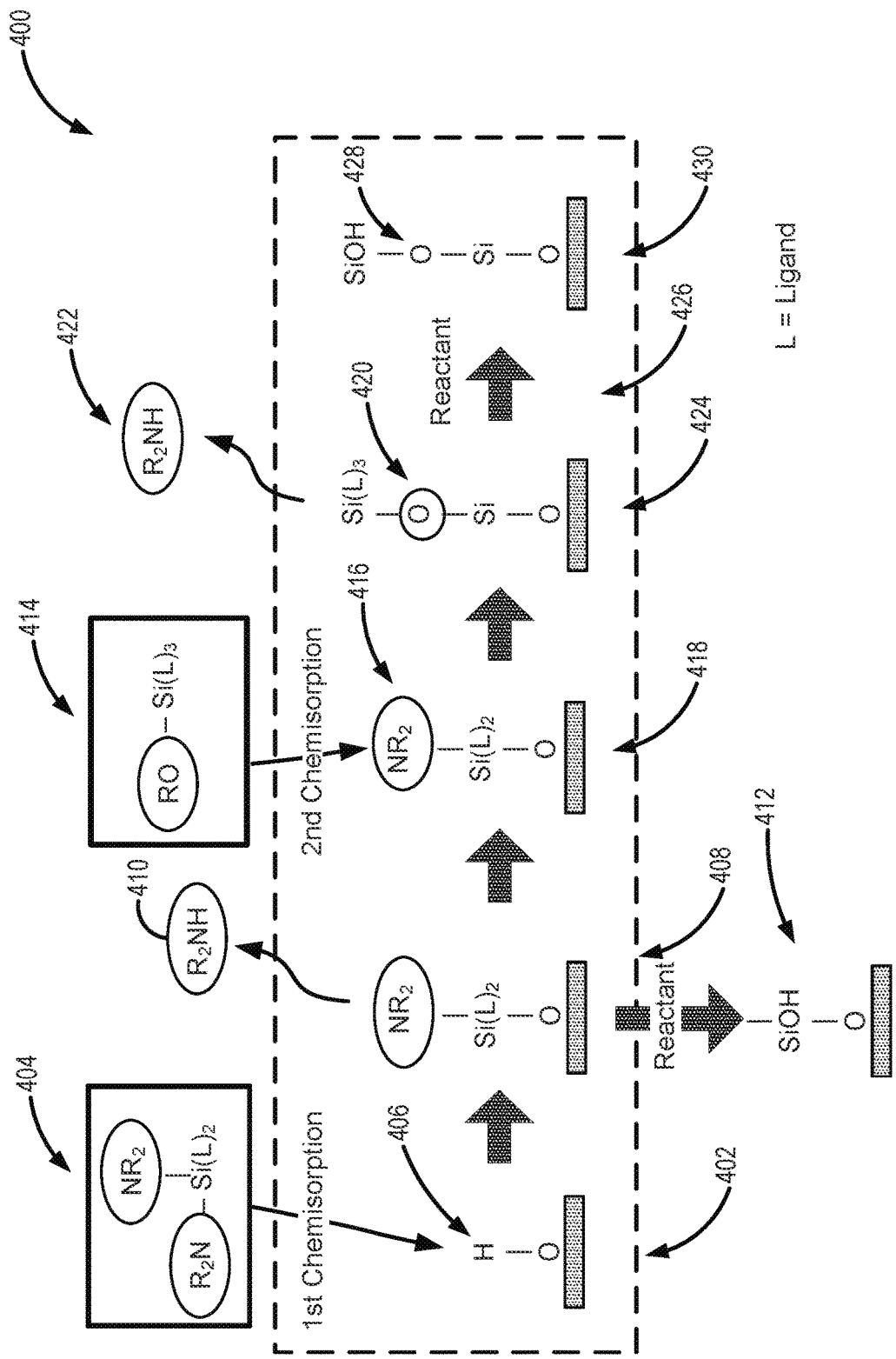

FIG. 4 further illustrates a reaction mechanism in accordance with at least one embodiment of the disclosure.

Figure 5:
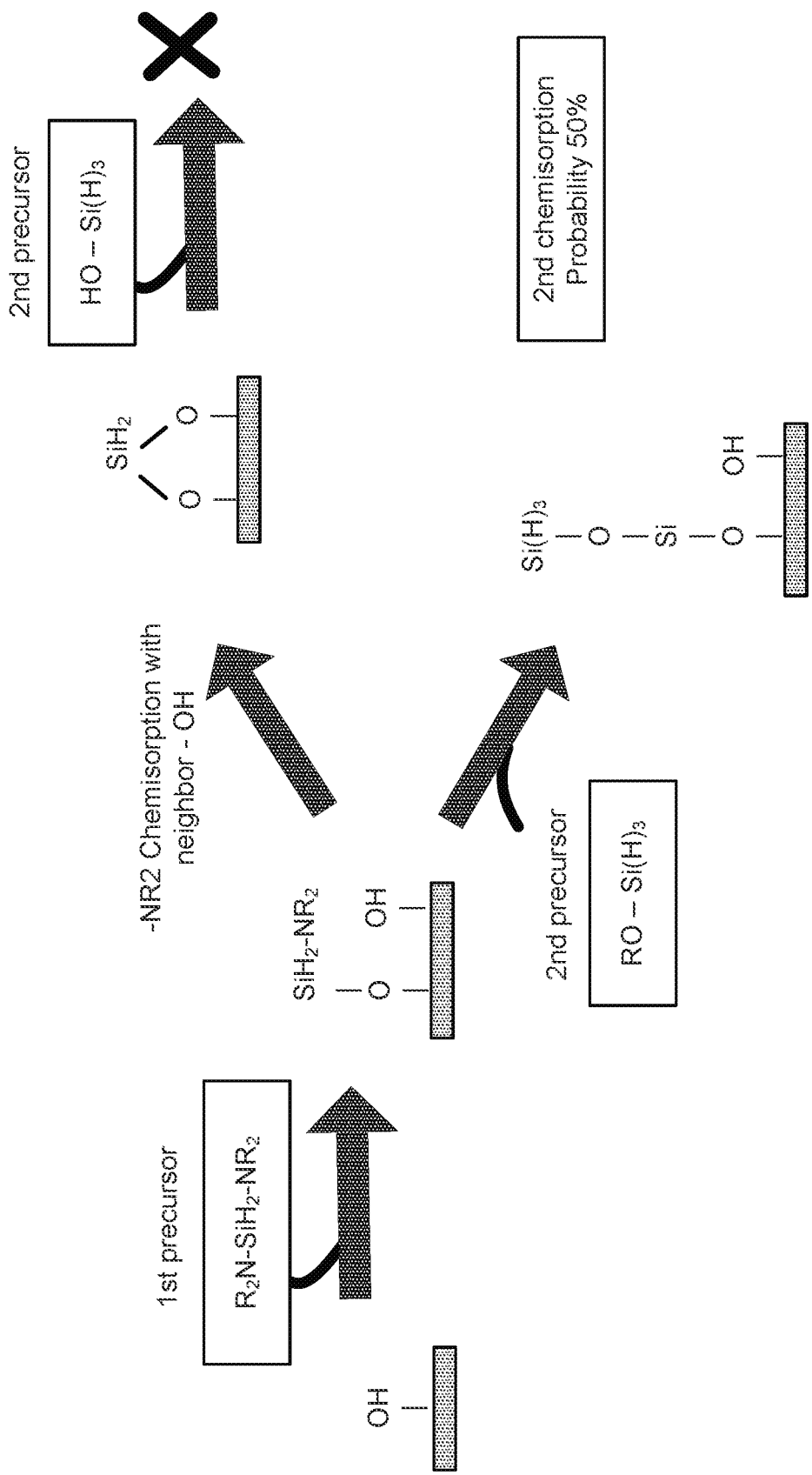
Figure 6:
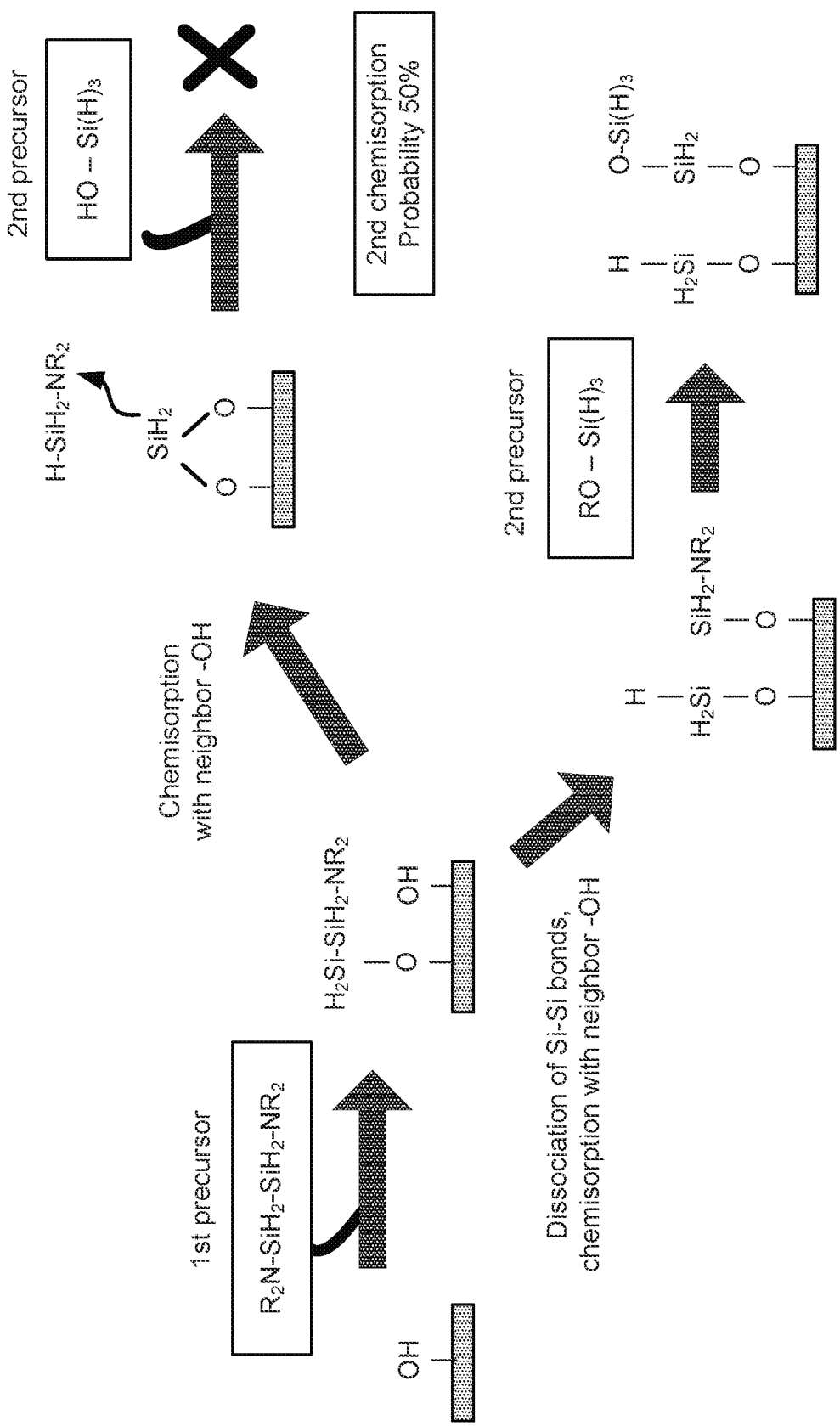
Figure 7:
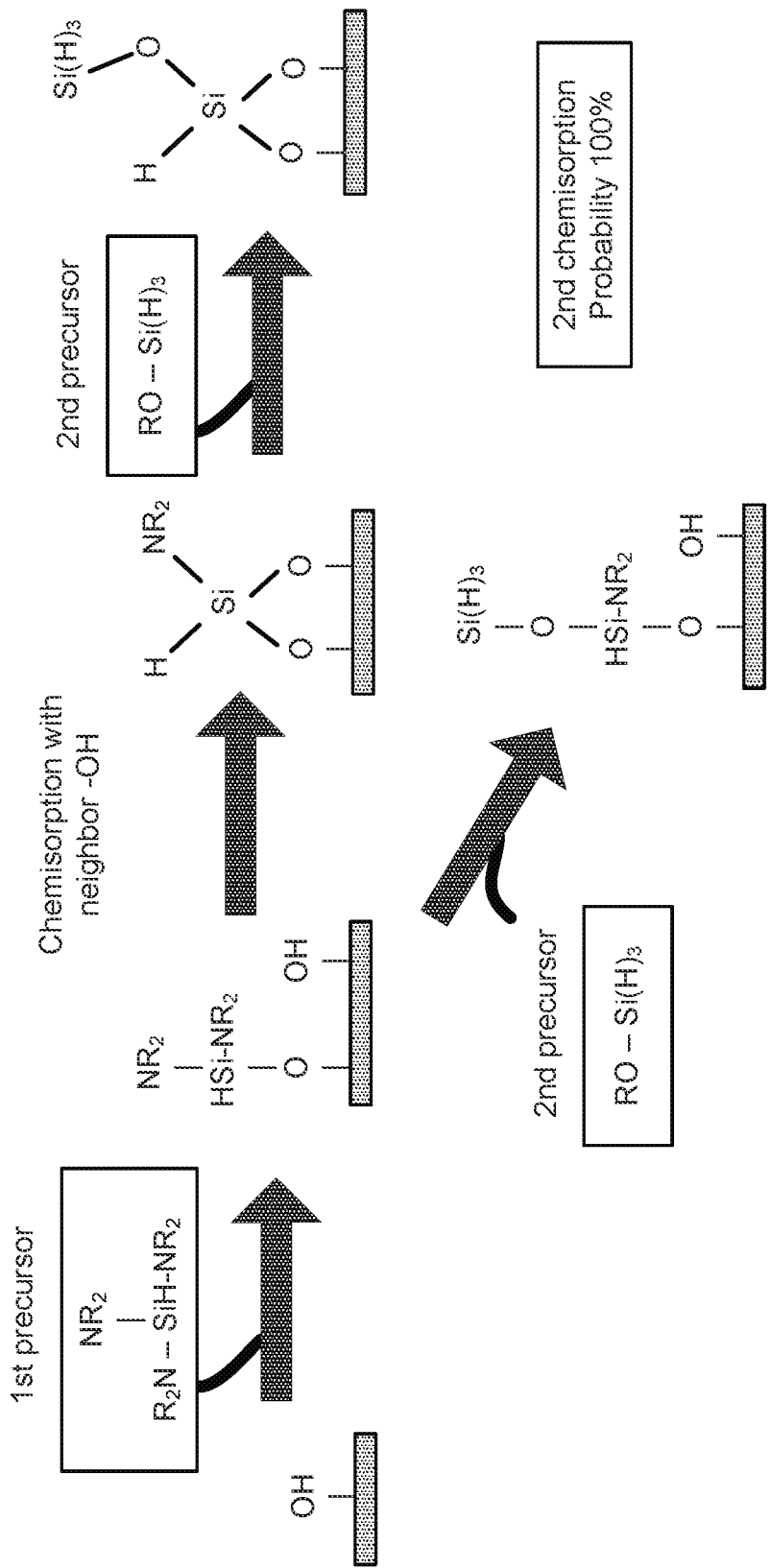

FIGS. 5-7 illustrate reaction mechanisms for various exemplary precursors in accordance with embodiments of the disclosure.

Figure 8:
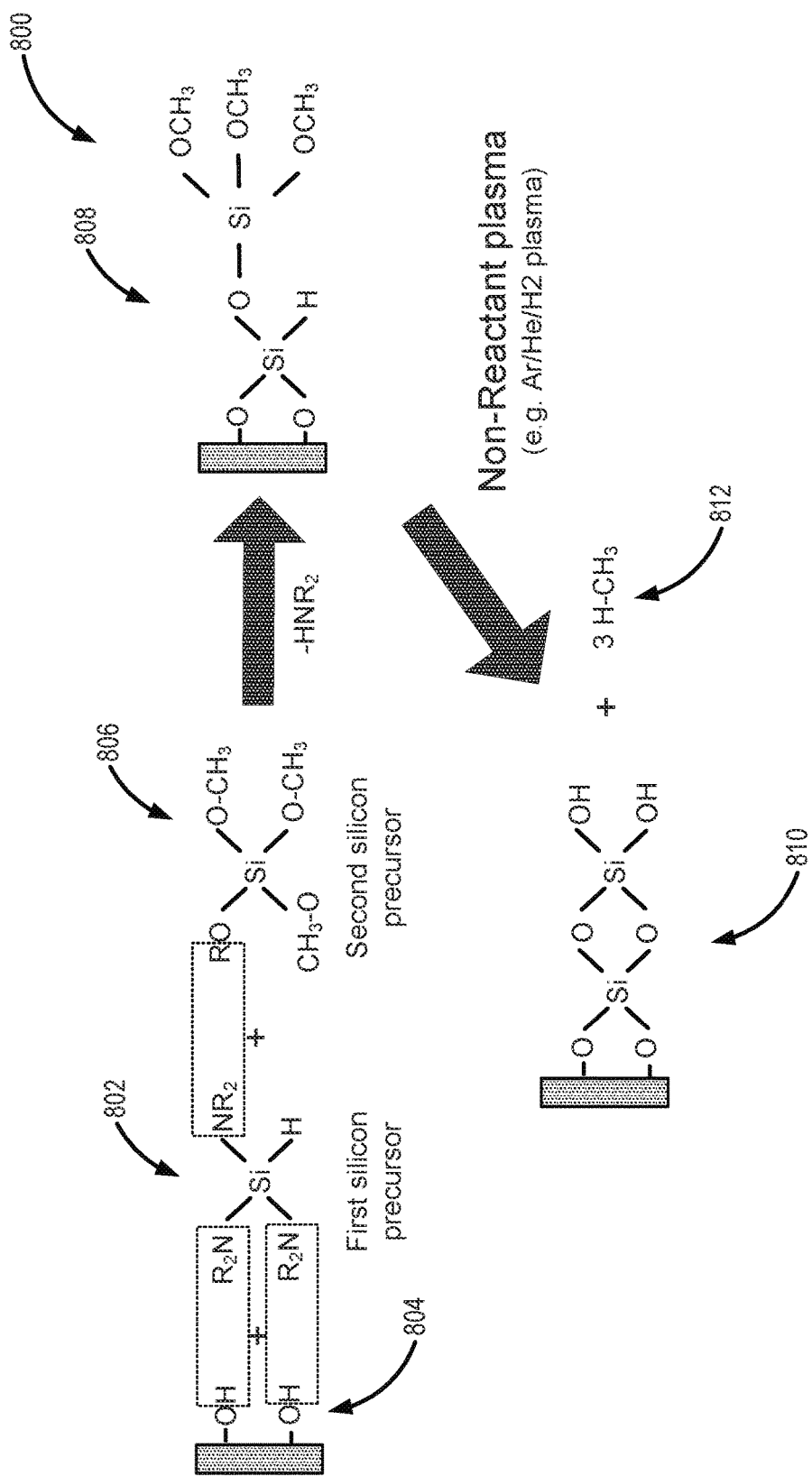

FIG. 8 illustrates a reaction mechanism using non-oxygen plasma in accordance with embodiments of the disclosure.

Figure 9:
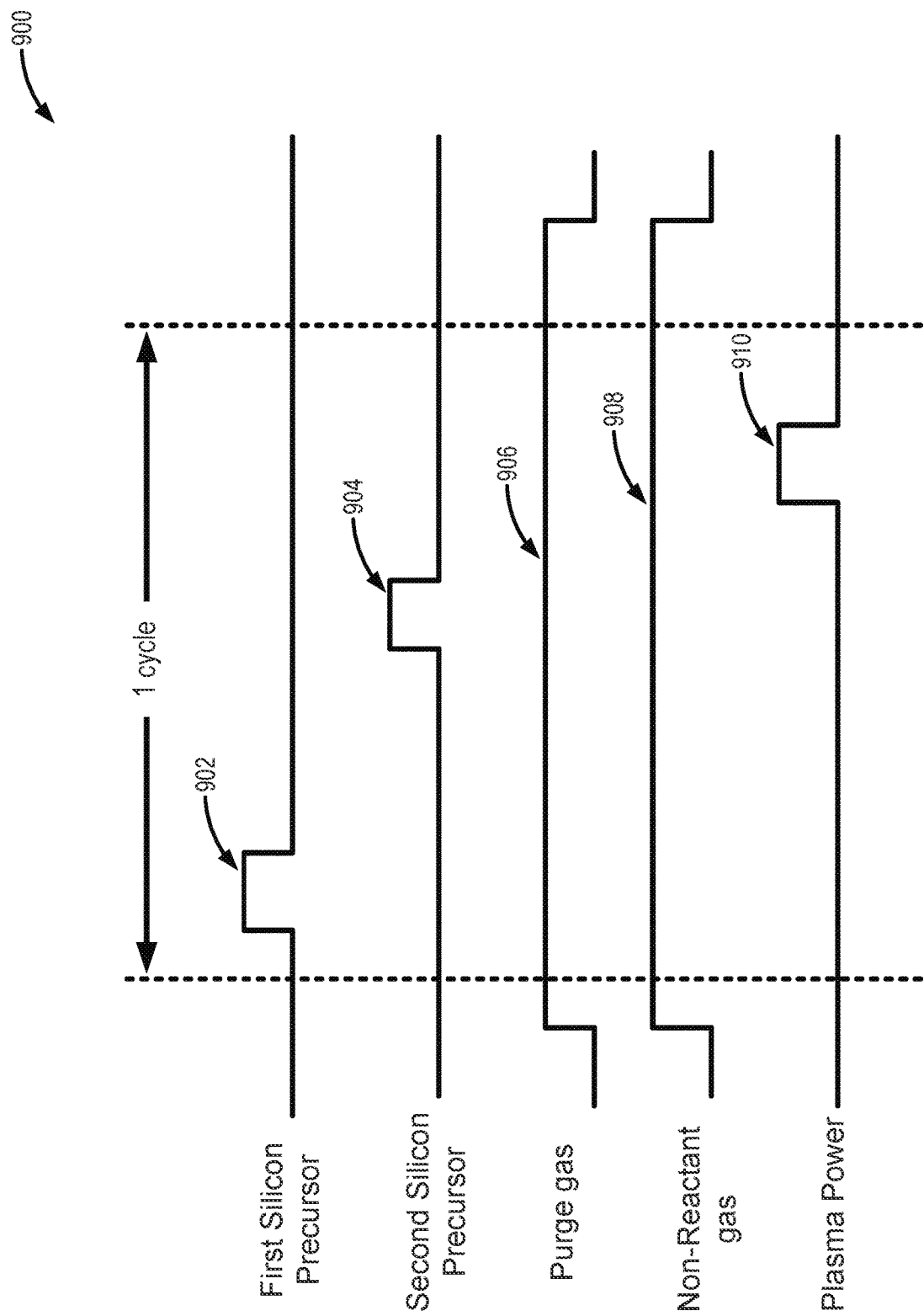
Figure 10:
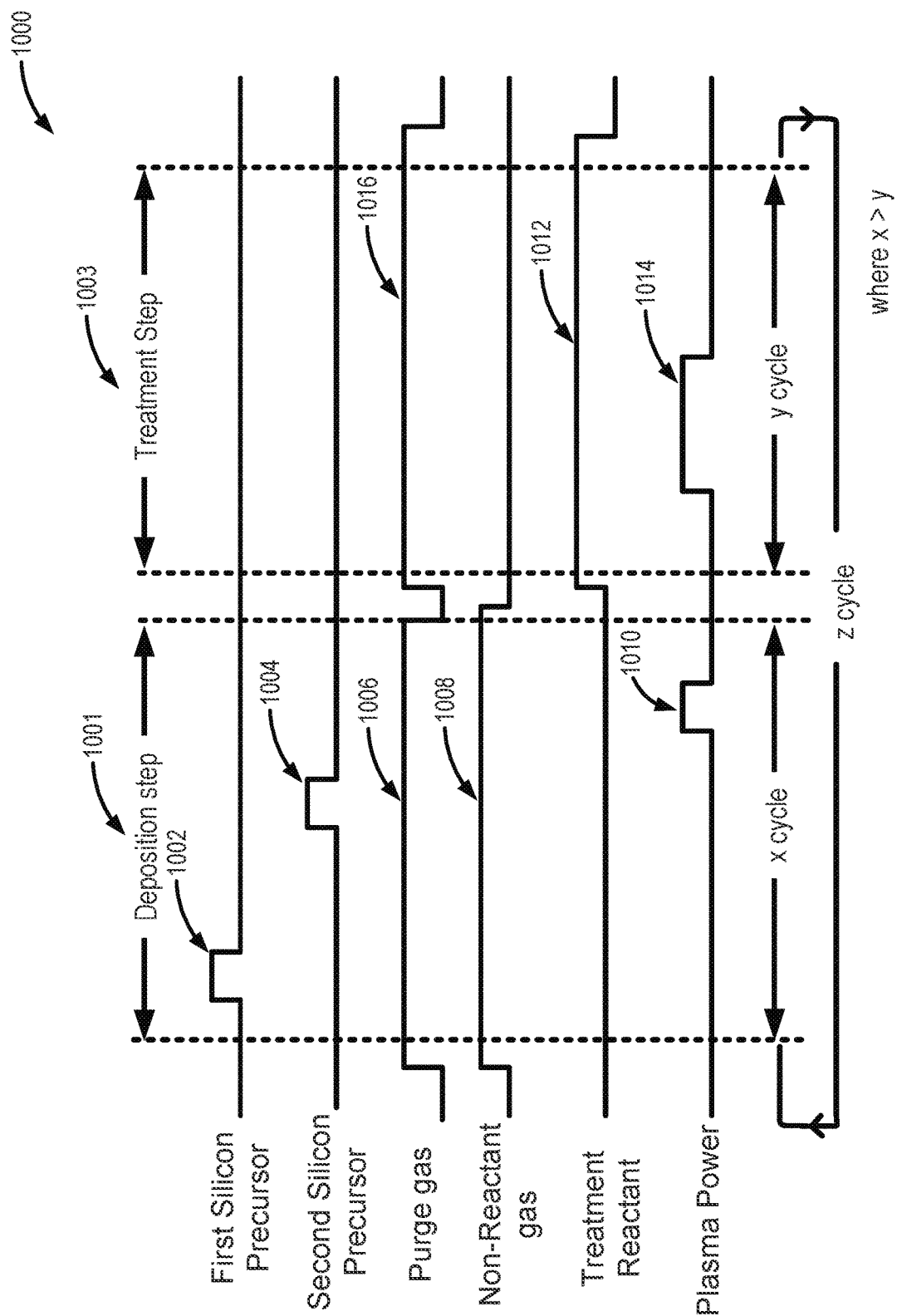

FIGS. 9 and 10 illustrate timing sequences according to additional embodiments of the disclosure.

Figure 11:
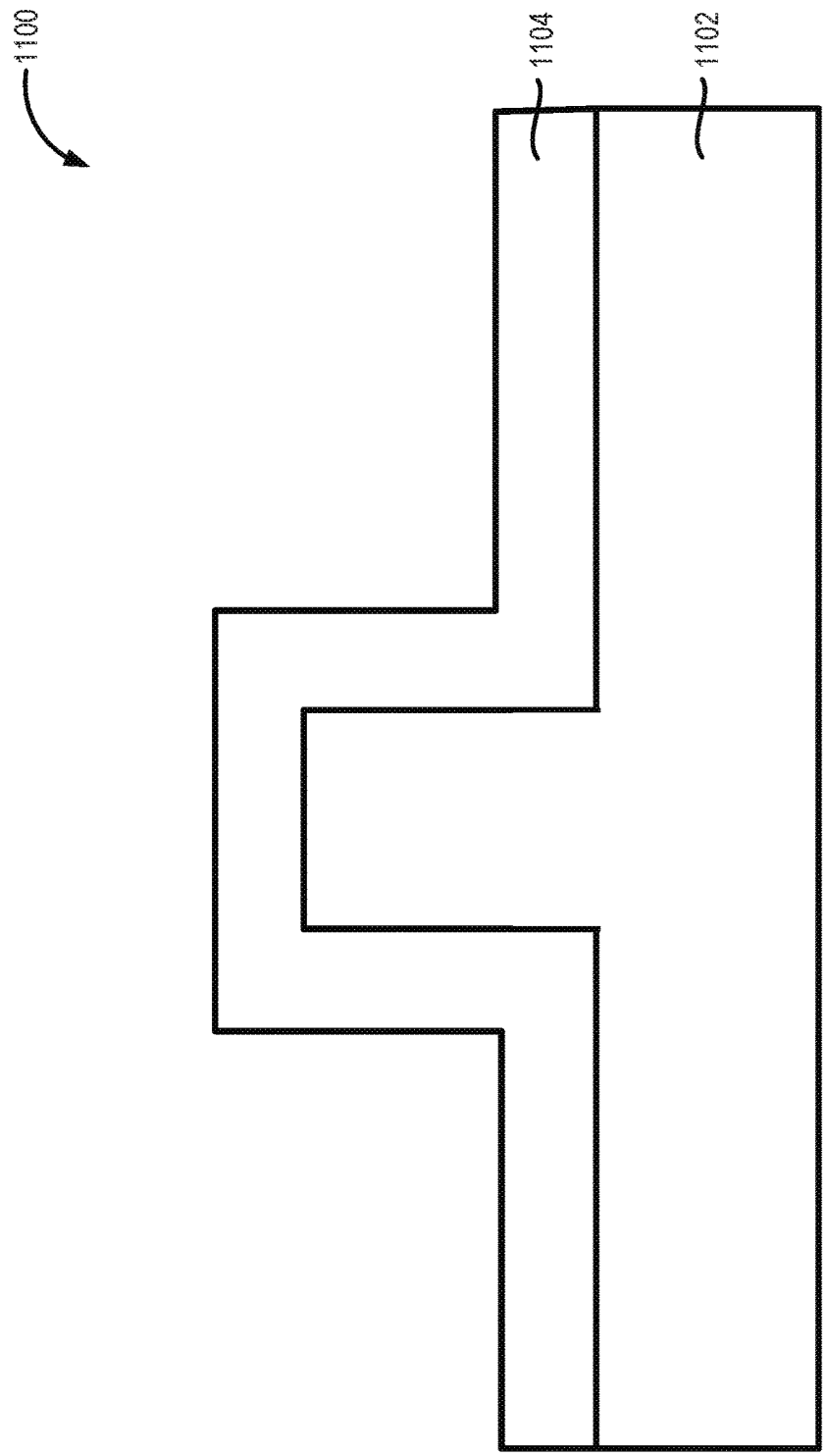

FIG. 11 illustrates a structure in accordance with at least one embodiment of the disclosure.

Figure 12:
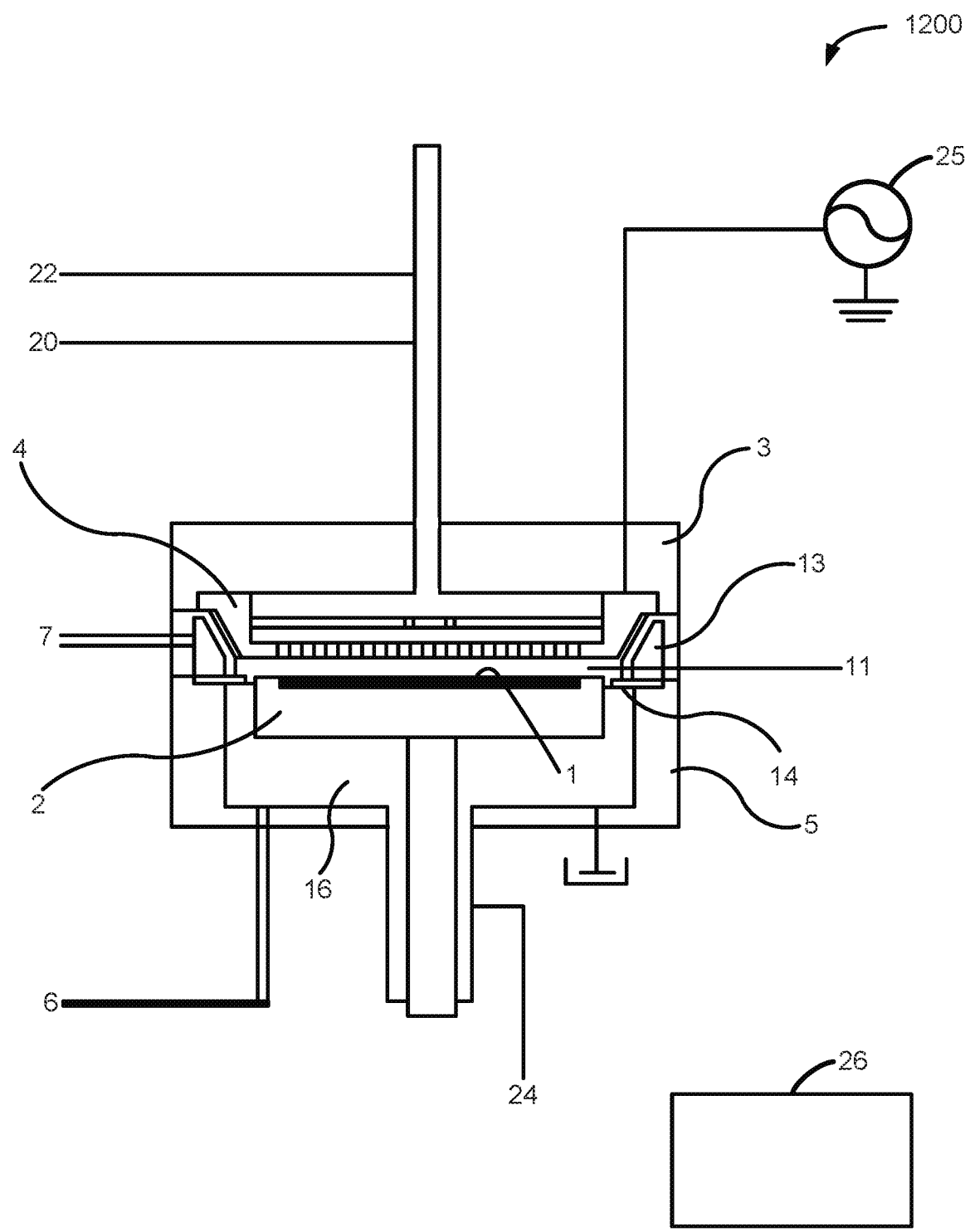

FIG. 12 illustrates a system in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the disclosure extends beyond the specifically disclosed embodiments and/or uses and obvious modifications and equivalents thereof. Thus, it is intended that the scope of the disclosure should not be limited by the particular embodiments described below.

The present disclosure generally relates to cyclical deposition methods, to structures formed using the methods, and to systems for performing the methods. The systems and methods described herein can be used to form conformal silicon oxide material or layers at relatively high deposition rates, compared to traditional cyclical methods, particularly to typical atomic layer deposition methods.

As set forth in more detail below, in accordance with examples of the disclosure, two silicon precursors are provided sequentially and alternately to a substrate surface (e.g., within a reaction chamber). The silicon precursors each have reactive functional groups, which chemically react and form two silicon-containing layers. After the two silicon layers are formed, an oxygen-containing reactant, or a non-reactant active species or non-oxygen containing, non-reactant gas, is provided to react with the silicon layers to form multiple silicon oxide layers per unit deposition cycle. As further set forth below, exemplary methods can also include a treatment step to, for example, provide silicon oxide with a desired chemical composition (e.g., stoichiometric or near stoichiometric) and/or with desired surface termination. Silicon oxide formed according to the disclosure may be a metal-free and/or a halogen-free film and may have a good (e.g., composition and/or thickness) uniformity.

In this disclosure, "gas" may include material that is a gas at room temperature and pressure, a vaporized solid and/or a vaporized liquid, and may be constituted by a single gas or a mixture of gases, depending on the context. A gas other than the process gas, i.e., a gas introduced without passing through a gas distribution assembly, such as a showerhead, other gas distribution device, or the like, may be used for, e.g., sealing the reaction space, and may include a seal gas, such as a rare gas. In some embodiments, the term "precursor" can refer to a compound that participates in the chemical reaction that produces another compound, and particularly to a compound that constitutes a film matrix or a main skeleton of a film; the term "reactant" can be used to refer to a compound that adds an element, such as oxygen to the film. In some cases, precursor and reactant can be used interchangeably. The term "inert gas" or "non-reactant active species" or "non-reactant gas" can refer to a gas that does not take part in a chemical reaction and/or a gas that excites a precursor when plasma power is applied, but unlike a reactant, it may not become a part of a film matrix to an appreciable extent. Exemplary inert or non-reactant gases include $H_2$, He, Ar, $N_2$ or other nitrogen-containing gas, and any combination thereof.

As used herein, the term "substrate" may refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as a Group II-VI or Group III-V semiconductor, and can include one or more layers overlying or underlying the bulk material. Further, the substrate can include various features, such as recesses, lines, and the like formed within or on at least a portion of a layer of the substrate. Features can have relatively high aspect ratios, ranging from, for example, about 1 to about 50 or about 3 to about 20.

As used herein, the term "film" and/or "layer" can refer to any continuous or non-continuous structures and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, the term "cyclic deposition" can refer to the sequential introduction of precursors (reactants) into a reaction chamber to deposit a film over a substrate.

As used herein, the term "atomic layer deposition" (ALD) can refer to a vapor deposition process in which deposition cycles, typically a plurality of consecutive deposition cycles, are conducted in a reaction chamber. Typically, during each cycle, the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, a reactant (e.g., another precursor, reaction gas, and/or inert gas) may subsequently be introduced into the reaction chamber for use in converting the chemisorbed precursor to the desired material on the deposition surface. Typically, this reactant is capable of further reaction with the precursor (e.g., cleaving a portion of the adsorbed precursor). Further, purging steps may also be utilized during each cycle to remove excess precursor from the reaction chamber and/or remove excess reactant and/or reaction byproducts from the reaction chamber after conversion of the chemisorbed precursor. Further, the term "cyclical deposition," as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor composition(s), reactive gas, and purge (e.g., inert carrier) gas. PEALD refers to an ALD process, in which a plasma is applied during one or more of the ALD steps.

As used herein, a "structure" can include a substrate as described herein. Structures can include one or more layers, overlying the substrate, which are formed as described herein.

As used herein, "silicon oxide" refers to material that includes silicon and oxygen. The material may not necessarily be stoichiometric silicon dioxide. In some cases, silicon oxide can include other elements, such as H, N, C, and the like. Such other elements are generally present in an amount less than 10 at % or less than 1 at %.

In this disclosure, "continuously" can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

Figure 1:
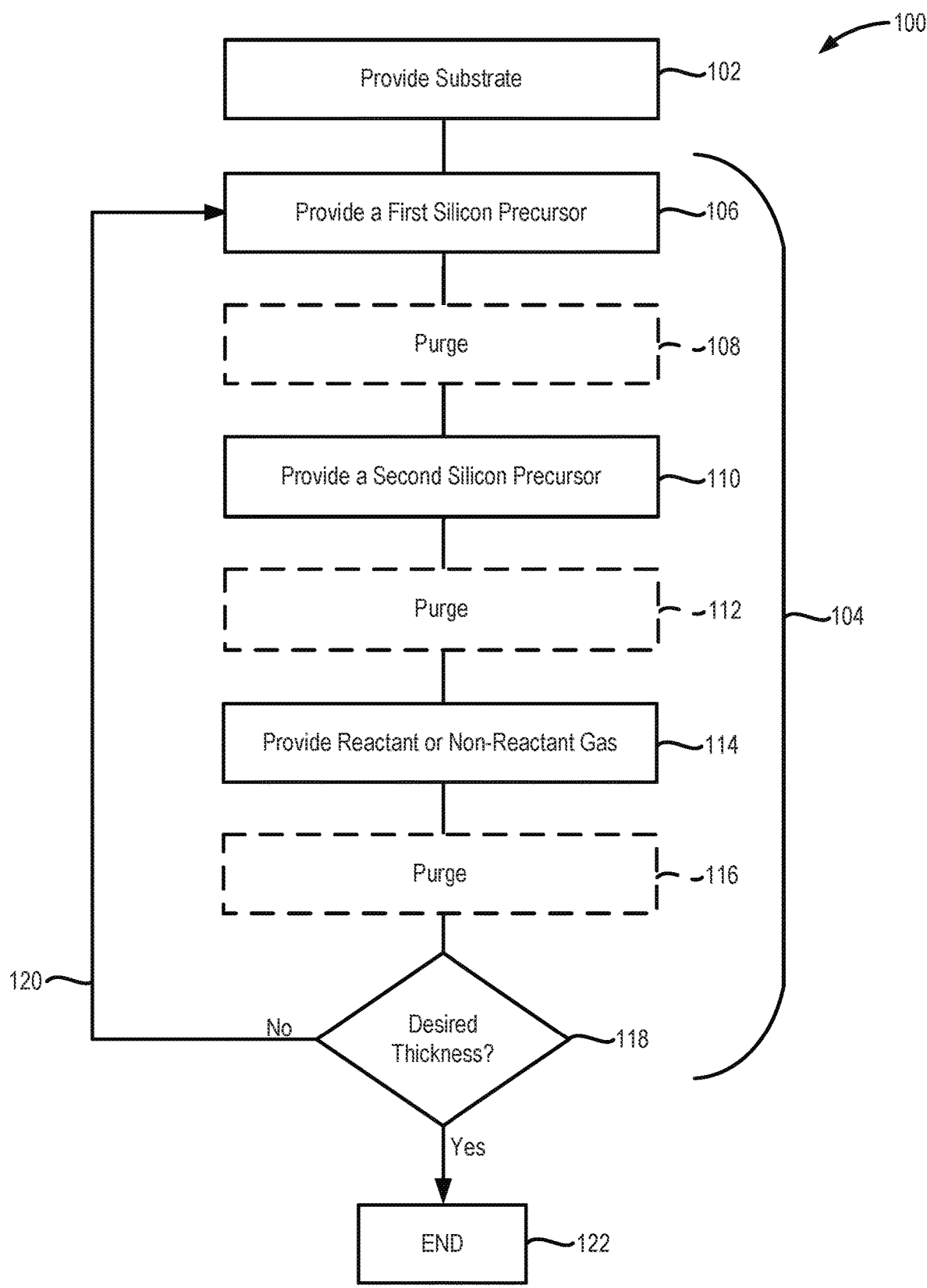
FIG. 1 illustrates a method according to at least one embodiment of the disclosure.

Turning now to the figures, FIG. 1 illustrates a cyclical deposition method 100 in accordance with at least one embodiment of the disclosure. Method 100 includes the steps of providing a substrate within a reaction chamber 102 and depositing a layer comprising silicon oxide on the substrate 104.

During step 102 of providing a substrate within a reaction chamber, a substrate is provided into a reaction chamber of a gas-phase reactor. In accordance with examples of the disclosure, the reaction chamber can form part of an atomic layer deposition (ALD) reactor, such as a plasma-enhanced ALD (PEALD) reactor. Various steps of methods described herein can be performed within a single reaction chamber or can be performed within multiple reaction chambers of a reactor system.

During step 102, the substrate can be brought to a desired temperature and/or the reaction chamber can be brought to a desired pressure, such as a temperature and/or pressure suitable for subsequent steps. By way of examples, a temperature (e.g., of a substrate or a substrate support) within a reaction chamber can be greater than 25° C. and less than or equal 600° C. or 550° C. or be between about 50° C. and about 400° C. A pressure within the reaction chamber can be from about 5 Pa to about 5000 Pa or about 100 Pa to about 2000 Pa. These temperatures and pressures can be suitable for all steps of method 100.

As illustrated in FIG. 1, depositing a layer comprising silicon oxide on the substrate 104 can include several steps, including providing a first silicon precursor to the reaction chamber 106, providing a second silicon precursor 110, and providing a reactant 114. Step 104 can also include one or more purge steps, such as purge 108, 112, and/or purge 116. Further, one or more deposition cycles (e.g., including steps 106, 110, 114 or steps 106-114) can be repeated a number of times (loop 120) until a desired thickness of a layer comprising silicon oxide is formed on the substrate. Various step of step 104 can overlap and/or be continuous through one or more deposition cycles.

Step 106 includes providing a first silicon precursor to the reaction chamber. The first precursor can include a compound including two or more ligands independently selected from the group consisting of —NR$_2$ ligands. Additionally or alternatively, the first precursor can include a compound including at least two or more Si—N bonds. Each R of each —NR$_2$ ligand can be independently selected. In accordance with examples of the disclosure, each R of each —NR$_2$ ligand is independently selected from the group consisting of —CH$_3$, —CH$_2$CH$_3$, —CH$_2$CH$_2$CH$_3$, —CH$_2$CH$_2$CH$_2$CH$_3$, isopropyl (—CH(CH$_3$)$_2$), isobutyl, sec-butyl, tert-butyl, —SiH3, —Si(CH$_3$)$_3$, and H; where for at least one —NR$_2$ ligand, if a first R=H, the second R≠H. Thus, the precursor would not include —NH$_2$.

By way of examples, a chemical formula of the first silicon precursor can be represented as:

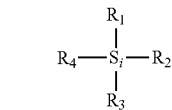

where at least two of R1-R4 are independently selected —NR$_2$ ligands, such as the —NR$_2$ ligands described herein. The other two of R1-R4 can be independently selected from the group consisting of —NR$_2$ ligands as described herein, or independently H or C1 to C6 from linear or branched, saturated, singly or multiply unsaturated, cyclic hydrocarbon.

An additional chemical formula of the first silicon precursor can be represented as:

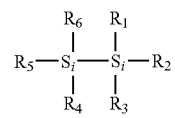

where at least two of R1-R6 are independently selected —NR$_2$ ligands, such as the —NR$_2$ ligands described herein. The other of R1-R6 can be independently selected from the group consisting of —NR$_2$ ligands as described herein, or independently H or C1 to C6 from linear or branched, saturated, singly or multiply unsaturated, cyclic hydrocarbon.

With reference to the formulas above, in some cases, at least two of the independently selected —NR$_2$ ligands can have the same chemical formula. By way of particular examples, the first silicon precursor can be or include an aminosilane and/or a silylamine. The aminosilane can be selected from the group consisting of DSMA, (SiH$_3$)$_2$NMe; DSEA, (SiH$_3$)$_2$NEt; DSIPA, (SiH$_3$)$_2$N(iPr); DSTBA, (SiH$_3$)$_2$N(tBu); DEAS, SiH$_3$NEt$_2$; DTBAS, SiH$_3$N(tBu)$_2$; BDEAS, SiH$_2$(NEt$_2$)$_2$; BDMAS, SiH$_2$(NMe$_2$)$_2$; BTBAS, SiH$_2$(NHtBu)$_2$; BITS, SiH$_2$(NHSiMe$_3$)$_2$; DIPAS, SiH$_3$N(iPr)$_2$; 3DMAS, SiH(N(Me)$_2$)$_3$; BEMAS, SiH$_2$[N(Et)(Me)]$_2$; TEMS, SiH(NEtMe)$_3$; TIPAS, SiH(N-HiPr)$_3$; BDIPADS, (NiPr$_2$)—SiH$_2$—SiH$_2$(NiPr$_2$); BDEADS, (NEt$_2$)SiH$_2$—SiH$_2$(NEt$_2$); BDPADS, (NPr$_2$)SiH$_2$—SiH$_2$(NPr$_2$). The silylamine can be selected from the group consisting of HMDS, (SiMe$_3$)2NH; TSA, (SiH$_3$)$_3$N; DIPAS-DSA, (NiPr$_2$)SiH$_2$—N(SiH$_3$)$_2$.

A flowrate of the first silicon precursor during step 106 can be from about 10 to about 2000 sccm. A duration of step 106 can be between about 0.05 and about 30 seconds.

In accordance with embodiments of the disclosure, during step 106, at least one Si—N bond of the first silicon precursor adsorbed onto substrate surface remains intact on surface after adsorption.

During step 108, the reaction chamber is purged. The term purge can refer to a process step in which precursors, reactants, and/or byproducts are removed from a reaction chamber. During a purge, an inert or substantially inert gas can be provided to the reaction chamber. Additionally or alternatively, the reaction chamber may be evacuated using a vacuum source, such as a vacuum pump, during a purge step. A duration of a purge step can be between about 0.05 and about 60 seconds.

During step 110, a second silicon precursor is provided. The second silicon precursor can be provided within the reaction chamber or within another reaction chamber—e.g., another reaction chamber of the same system (e.g., cluster tool). The second silicon precursor can include at least one independently selected —OR ligand. Additionally or alternatively, the second precursor can include at least one Si—OR bond. Each —OR ligand of the at least one —OR ligand can be independently selected from the group consisting of hydroxide (—OH), alkoxy (—OCxHy—), and siloxy (—OSiCwHz—), where x is between 1 and 5 or 2 and 8 and y is between 3 and 11 or 3 and 9, w is between 3 and 15 or 6 and 24, and z is between 15 and 33 or 9 and 27. By way of particular examples, the second silicon precursor can be or include silanol. Exemplary silanols suitable for use with method 100 include tris(tert-pentoxy)silanol, tris(tert-butoxy)silanol, bis(tert-butoxy)(isopropoxy)silanol, bis(iso-propoxy)(tert-butoxy)silanol, bis(tert-pentoxy)(iso-propoxy)silanol, bis(iso-propoxy)(tert-pentoxy)silanol, bis(tert-pentoxy)(tert-butoxy)silanol, bis(tert-butoxy)(tert-pentoxy)silanol, diethoxymethylsilane (DEMS), dimethyldimethoxysilane (DMDMOS), di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyidi-t-butoxysiloxane, tetraethoxysilane (TEOS), tetramethoxysilane (TMOS), hexamethyldisiloxane (HMDSO), and the like.

An exemplary chemical formula for the second silicon precursor is:

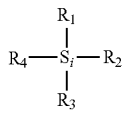

where at least one, and in some cases, at least two of R1-R4 are or include an —OR ligand as described herein.

An additional chemical formula of the first silicon precursor can be represented as:

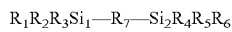

where at least one, and in some cases, at least two of R1-R6 are or include an —OR ligand as described herein, and R7 consists of C1 to C4 selected from linear or branched, saturated, singly or multiply unsaturated hydrocarbon.

A flowrate of the second silicon precursor during step 110 can be from about 10 to about 2000 sccm. A duration of step 110 can be between about 0.05 and about 30 seconds.

During step 112, the reaction chamber used during step 110 can be purged. Step 112 can be the same or similar to step 108.

During step 110, the second silicon precursor can be adsorbed onto a surface of the substrate—e.g., adsorbed onto a portion of the first silicon precursor.

During step 114, a reactant or a non-reactant gas is provided. The reactant or non-reactant gas can be provided to the reaction chamber used during step 106 and/or step 110. The reactant can include an oxygen-containing reactant. Exemplary oxygen-containing reactants include, for example, at least one of $O_2$, $N_2O$, $CO_2$, plasma species formed therefrom, and oxygen radicals, or any combination thereof. In accordance with other examples of the disclosure, the non-reactant gas can include a gas used to form activated species that do not include oxygen. Examples of non-reactant gases are described in more detail below.

A plasma can be applied during step 114. In these cases, a plasma power can range from about 10 to about 2800 W. A frequency of the plasma power can be between about 400 kHz and about 60 MHz.

During step 116, the reaction chamber used during step 114 can be purged. Step 116 can be the same or similar to step 108 and/or step 112.

During method 100, a first NR2 ligand of the first silicon precursor can react with a functional group on the substrate, e.g.an —OH function group, and another $NH_2$ ligand can react with a ligand of the second silicon precursor, leaving a byproduct, e.g. $HNR_2$(where each R is an, e.g., independently-selected alkyl ligand). Thus, dual Si layers are formed without an additional reactant. Then an oxygen reactant is provided to enhance an oxidation of the film and form —OH bonding sites on the surface of the outermost silicon layers. Therefore according to this embodiment of the disclosure, dual SiO layers per unit cycle are formed, which improves a film growth rate and the film growth is driven by a chemical reactivity between two silicon precursors.

At step 118, it can be determined whether a desired thickness of silicon oxide material is achieved. If yes, the process can end 122. If not, step 104 can be repeated. The desired thickness can be determined by measurement or by performing a number of cycles of step 104.

Figure 2:
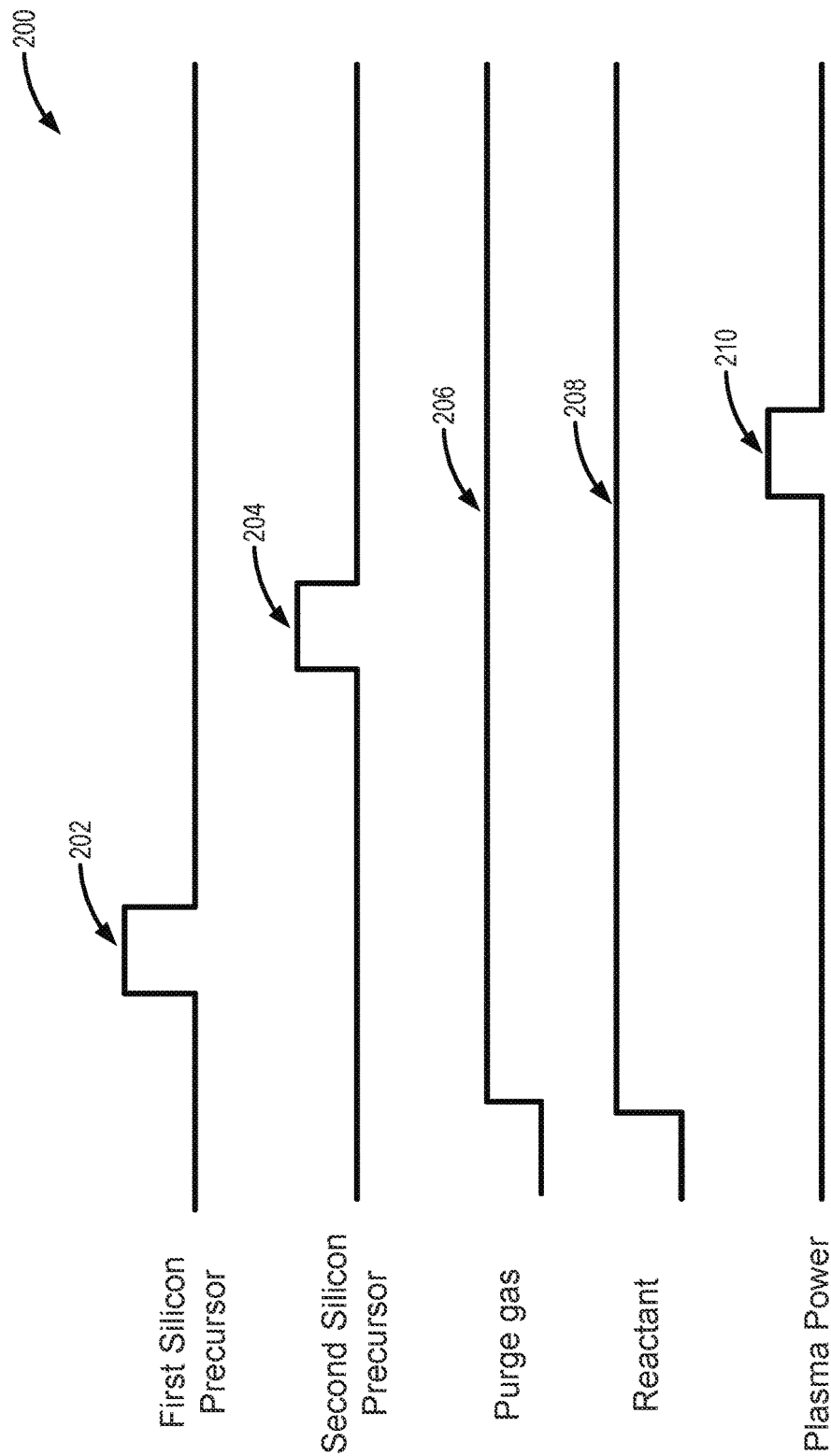
FIG. 2 illustrates a timing sequence according to at least one embodiment of the disclosure.

FIG. 2 illustrates a timing sequence 200 suitable for use with method 100 in which a reactant is used in accordance with examples of the disclosure. In the illustrated example, a plasma is used to form excited species from the reactant provided in step 114. As illustrated, the first silicon precursor can be provided for a first silicon precursor pulse period 202 (e.g., step 106), the second silicon precursor can be provided for a second silicon precursor pulse period 204 (e.g., step 110), a purge gas can be provided for a purge gas period 206 (e.g., continuously through one or more first silicon precursor pulse periods 202 and second silicon precursor pulse periods 204—e.g., steps 108, 112, and 116), a reactant can be provided for a reactant period 208 (e.g., continuously through one or more first silicon precursor pulse periods 202 and second silicon precursor pulse periods 204—e.g., step 114), and a plasma power can be provided for a plasma power period 210 (e.g., during step 114).

Figure 3:
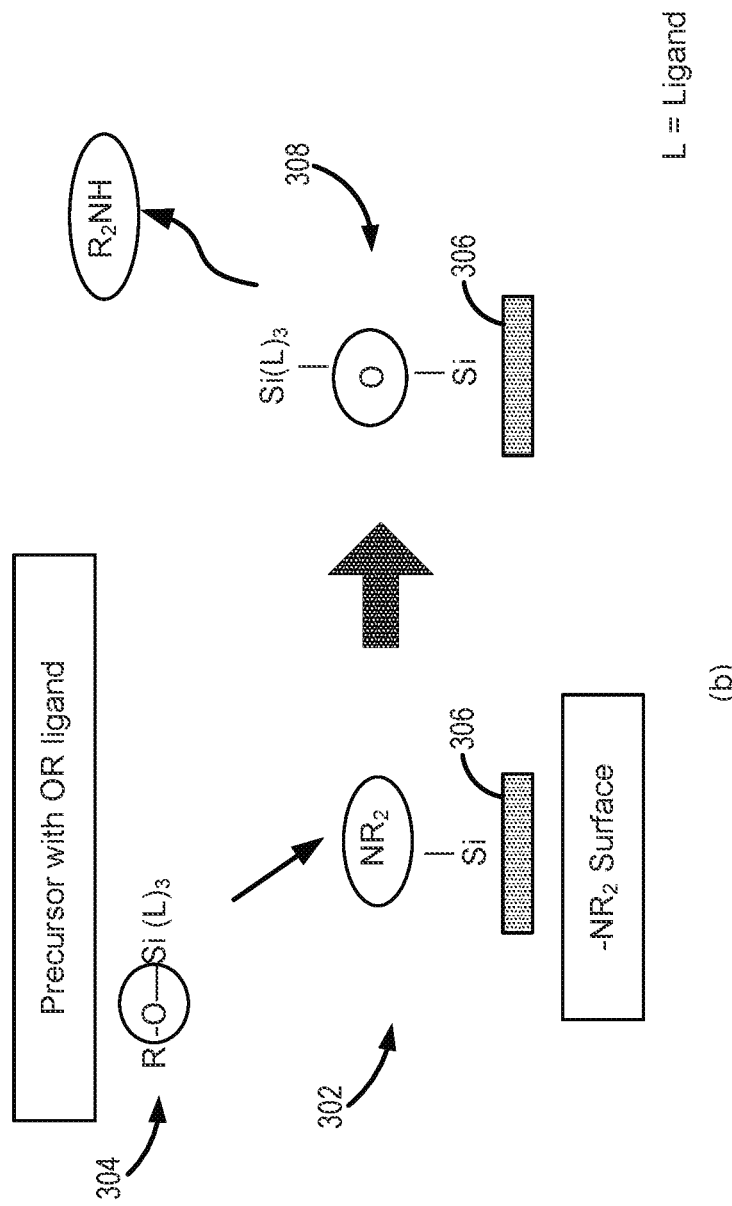
FIG. 3 illustrates a reaction mechanism in accordance with at least one embodiment of the disclosure.

FIG. 3 illustrates a reaction mechanism that a first silicon precursor reacts with a surface 306 to leave species 302 thereon, and a second silicon precursor 304 reacts with chemisorbed species 302. A reaction with second precursor 304 occurs on an —$NR_2$-terminated surface of species 302. The —$NR_2$ ligand drives a reaction with a second precursor containing an —OR ligand and forms a dual Si layer 308 without reactant.

FIG. 4 illustrates a comparison of a reaction mechanism according to the present disclosure, compared to a reaction mechanism of a typical ALD process. At a stage 402, a first silicon precursor 404 is adsorbed onto a (e.g., —OH terminated) surface 406 of a substrate. At stage 408, an —$NR_2$ ligand is removed (e.g., as $R_2NH$, with the H obtained from species on surface 406). In a conventional ALD process, a reactant is then introduced to the reaction chamber and reacts with the first silicon precursor to form silicon oxide (stage 412). In contrast, in accordance with examples of the disclosure, a second silicon precursor 414 reacts with species 416 remaining on surface 406 at stage 418. Species 420 is thus formed, and species 422 (e.g., $R_2NH$) is removed at stage 424. At stage 426, the reactant is introduced or is activated by plasma power to form silicon oxide 428 that has —OH terminated surface at stage 430.

FIG. 5 illustrates a type of first chemisorption and how the number of Si—N bonds or a number of —NR2 groups of the first silicon precursor can affect a second chemisorption. If the silicon precursor includes only one Si—N bond or one-NR2 group, chemical adsorption of the second precursor may not occur. However, if the first silicon precursor includes two Si—N bonds or two-NR2 groups chemisorption can occur (e.g., at 50% probability).

FIG. 6 illustrates another example, where the first silicon precursor includes two Si—N bonds or two-$NR_2$ groups, e.g., in the form of an $NR_2$—Si—Si—$NR_2$ type of molecule. In this case the first silicon precursor includes multiple silicon atoms in the molecule structure and a second chemisorption of 50% probability is possible.

FIG. 7 illustrates an example, in which the first silicon precursor includes three Si-N bonds or three-NR2 groups. In this case a second chemisorption of 100% probability is possible.

As noted above, in accordance with some examples of the disclosure, non-reactant gas that does not include activated oxygen species may be used to form silicon oxide. Activated reactants, e.g. oxygen radicals, may cause a damage to the sublayer. Thus, in some cases, it may be desirable to not use activated oxygen species.

FIG. 8 illustrates a mechanism 800 that does not include use of activated oxygen species, but rather uses a non-reactant active species. The method illustrated in FIG. 8 may be used to mitigate a sub-layer damage that might otherwise occur if an activate reactant were used. In these cases, the second silicon precursor can include two or more ligands independently selected from the group consisting of —OR ligands, such as the —OR ligands described herein.

As illustrated mechanism 800 includes adsorbing a first silicon precursor 802 onto a surface of a substrate 804. A second silicon precursor 806 can react with an —$NR_2$ group of the first silicon precursor to form silicon-containing layer 808. Non-reactant active species can bombard the outermost surface of silicon-containing layer 808 and weaken the bonding structure. This can result in creating SI—OH bonds on the outermost surface of silicon oxide 810 and byproducts 812 that may be purged from the reaction chamber. The —OH terminated sites may react with the —NR2 ligand of the first silicon precursor in the next cycles. By way of particular examples, the first precursor may be an aminosilane and the second precursor may be an alkoxy-silanol. The non-oxygen plasma can include one or more of argon plasma species, helium plasma species, nitrogen-containing plasma species, hydrogen-containing plasma species, or any combination thereof. In this example, a silicon oxide film with high film growth rate may be formed by plasma enhanced atomic layer deposition, leaving less damage to a sublayer.

FIG. 9 illustrates another timing sequence 900 suitable for method 100 and mechanism 800. Timing sequence 900 includes a first silicon precursor pulse period 902 (e.g., step 106), a second silicon precursor pulse period 904 (e.g., step 110), a purge gas period 906 (e.g., continuously through one or more first silicon precursor pulse periods 902 and second silicon precursor pulse periods 904—e.g., steps 108, 112, and 116), a non-reactant period 908 (e.g., continuously through one or more first silicon precursor pulse periods 902 and second silicon precursor pulse periods 904—e.g., step 114), and a plasma power period 910 (e.g., during step 114). Timing sequence 900 can be the same or similar to timing sequence 200, except a non-reactant active species is formed/provided, rather than a reactant active species. In the illustrated example, plasma power can be applied during each deposition cycle of sequence 900.

FIG. 10 illustrates another timing sequence 1000 in accordance with examples of the disclosure. Similar to timing sequences 200 and 900, timing sequence 1000 includes deposition cycle 1001, including a first silicon precursor pulse period 1002 (e.g., step 106), a second silicon precursor pulse period 1004 (e.g., step 110), a purge gas period 1006, a non-reactant gas period 1008, and a plasma power period 1010 (e.g., during step 114). Deposition step 1001 can be the same or similar to timing sequence 900. Timing sequence further includes a treatment step 1003, which can be performed after one or more deposition steps 1001. For example, the method illustrated in FIG. 10 can include repeating deposition cycle 1001 one or more times, and after the step of repeating, performing an (e.g., oxygen plasma) treatment step 1003.

As illustrated, the treatment step includes introducing a reactant to a reaction chamber for a treatment reactant period 1012 and providing a plasma power to form activated species from the treatment reactant for a treatment plasma period 1014. The treatment reactant can include, for example, an oxygen-containing reactant including one or more of O2, N2O, and CO2.

In addition, the purge gas can be provided for treatment purge gas period 1016. As illustrated, deposition cycle 1001 can be repeated x cycles, treatment step 1003 can be performed y cycles (where x>y) and the entire sequence can be repeated z cycles.

FIG. 11 illustrates a structure 1100 formed in accordance with examples of the disclosure. Structure 1100 includes a substrate 1102 and a layer comprising silicon oxide 1104 formed according to a method described herein.

FIG. 12 illustrates a reactor system 1200 in accordance with exemplary embodiments of the disclosure. Reactor system 1200 can be used to perform one or more steps or sub steps as described herein and/or to form one or more structures or portions thereof as described herein.

Reactor system 1200 includes a pair of electrically conductive flat-plate electrodes 4, 2 in parallel and facing each other in the interior 11 (reaction zone) of a reaction chamber 3. A plasma can be excited within reaction chamber 3 by applying plasma power from power source 25 to one electrode (e.g., electrode 4) and electrically grounding the other electrode (e.g., electrode 2). A temperature regulator can be provided in a lower stage 2 (the lower electrode), and a temperature of a substrate 1 placed thereon can be kept at a desired temperature. Electrode 4 can serve as a gas distribution device, such as a shower plate. Precursor gas and carrier gas and/or the like can be introduced into reaction chamber 3 using one or more of a gas line 20 and a gas line 22. The gas can flow through shower plate 4. Although illustrated with two gas lines, reactor system 500 can include any suitable number of gas lines.

In reaction chamber 3, a circular duct 13 with an exhaust line 7 is provided, through which gas in the interior 11 of the reaction chamber 3 can be exhausted. Additionally, a transfer chamber 5, disposed below the reaction chamber 3, is provided with a seal gas line 24 to introduce seal gas into the interior 11 of the reaction chamber 3 via the interior 16 (transfer zone) of the transfer chamber 5, wherein a separation plate 14 for separating the reaction zone and the transfer zone is provided (a gate valve through which a wafer is transferred into or from the transfer chamber 5 is omitted from this figure). The transfer chamber is also provided with an exhaust line 6.

In some embodiments, continuous flow of a carrier gas to reaction chamber 3 can be accomplished using a flow-pass system (FPS), wherein a carrier gas line is provided with a detour line connected to a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber, and can carry the precursor for a period shorter than the carrier gas period.

A skilled artisan will appreciate that the apparatus includes one or more controller(s) 26 programmed or otherwise configured to cause one or more method steps as described herein to be conducted. The controller(s) are communicated with the various power sources, heating systems, pumps, robotics and gas flow controllers, or valves of the reactor, as will be appreciated by the skilled artisan.

The example embodiments of the disclosure described above do not limit the scope of the disclosure, since these embodiments are merely examples of the embodiments of the disclosure. Any equivalent embodiments are intended to be within the scope of this disclosure. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

The invention claimed is:

1. A cyclical deposition method comprising:
   providing a substrate within a reaction chamber; and
   depositing a layer comprising silicon oxide on the substrate, wherein a deposition cycle comprises:
      providing a first silicon precursor to the reaction chamber to form chemisorbed species;
      providing a second silicon precursor that reacts with the chemisorbed species;
      providing a reactant; and
      after the step of providing the second silicon precursor, forming a plasma using the reactant,
   wherein the first silicon precursor comprises two or more ligands independently selected from the group consisting of —$NR_2$ ligands, wherein each R of each $NR_2$ ligand is independently selected from the group consisting of —$CH_3$, —$CH_2CH_3$, —$CH_2CH_2CH_3$, —$CH_2CH_2CH_2CH_3$, isopropyl (—$CH(CH_3)_2$), isobutyl, sec-butyl, tert-butyl, -$SiH_3$, -$Si(CH_3)_3$, and H, where for at least one —$NR_2$ ligand, if a first R═H, the second R≠H, and
   wherein the second silicon precursor comprises at least one independently selected —OR ligand selected from the group consisting of hydroxide (—OH), alkoxy (—$OC_xH_y$—), and siloxy (—$OSiC_wH_z$—), where x is between 1 and 8, y is between 3 and 11, w is between 3 and 24, and z is between 9 and 33.

2. The method of claim 1, wherein the first precursor comprises an Si-Si bond.

3. The method of claim 1, wherein a chemical formula of the first silicon precursor is

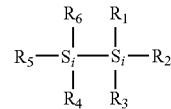

where at least two or R1-R6 are independently selected —$NR_2$ ligands, wherein each R of each $NR_2$ ligand is independently selected from the group consisting of —$CH_3$, —$CH_2CH_3$, —$CH_2CH_2CH_3$, —$CH_2CH_2CH_2CH_3$, isopropyl (—$CH(CH_3)_2$), isobutyl, sec-butyl, tert-butyl, —$SiH_3$, —$Si(CH_3)_3$, and H, where for at least one —$NR_2$ ligand, if a first R═H, the second R ≠H, and where the other of R1-R6 are independently selected from the group consisting of the $NR_2$ ligands, H or a C1 to C6 linear or branched, saturated, singly or multiply unsaturated, or cyclic hydrocarbon.

4. The method of claim 1, wherein at least two of the independently selected —$NR_2$ ligands have the same chemical formula.

5. The method of claim 1, wherein x is between 2 and 8.

6. The method of claim 5, wherein y is between 3 and 9.

7. The method of claim 5, wherein w is between 3 and 15 and z is between 15 and 33.

8. The method of claim 1, wherein the first silicon precursor comprises an aminosilane.

9. The method of any of claim 1, wherein the second silicon precursor comprises a silanol.

10. The method of claim 1, wherein the reactant comprises an oxygen-containing reactant comprising at least one of $O_2$, $N_2O$, $CO_2$, plasma species formed therefrom, and oxygen radicals, or any combination thereof.

11. A cyclical deposition method comprising:
   providing a substrate within a reaction chamber; and
   depositing a layer comprising silicon oxide on the substrate, wherein a deposition cycle comprises:
      providing a first silicon precursor to the reaction chamber;
      providing a second silicon precursor; and
      providing a non-reactant active species formed using a plasma,
   wherein the first silicon precursor comprises two or more ligands independently selected from the group consisting of —$NR_2$ ligands, wherein each R of each $NR_2$ ligand is independently selected from the group consisting of —$CH_3$, —$CH_2CH_3$, —$CH_2$ $CH_2CH_3$, —$CH_2CH_2CH_3$, isopropyl (—$CH(CH_3)_2$), isobutyl, sec-butyl, tert-butyl, —$SiH_3$, —$Si(CH_3)_3$, and H, where for at least one —$NR_2$ ligand, if a first R═H, the second R≠H, and
   wherein the second silicon precursor comprises two or more ligands independently selected from the group consisting of —OR ligands selected from the group consisting of hydroxide (—OH), alkoxy (—$OC_xH_y$—), and siloxy ($OSiC_wH_z$—), where x is between 1 and 8, y is between 3 and 11, w is between 3 and 24, and z is between 9 and 33.

12. The method of claim 11, wherein w is between 3 and 15.

13. The method of claim 11, wherein a chemical formula of the first silicon precursor is

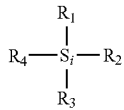

where at least two of R1-R4 are —NR$_2$ ligands; or

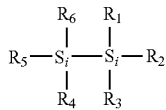

where at least two of R1-R4 are —NR$_2$ ligands.

14. The method of claim 13, wherein at least two of the —NR ligands have the same chemical formula.

15. The method of claim 11, wherein the first silicon precursor comprises an aminosilane and the second silicon precursor comprises an alkoxysilanol.

16. The method of claim 11, wherein the non-reactant active species comprise one or more of argon plasma species, helium plasma species, nitrogen-containing plasma species, hydrogen-containing plasma species, or any combination thereof.

17. The method of claim 11, wherein at least one of the —OR ligands is selected from the group consisting of hydroxide (—OH), alkoxy (—OC$_x$H$_y$—), where x is between 1 and 5 and y is between 3 and 11, or siloxy (—OSiC$_w$H$_z$), where w is between 3 and 15 and z is between 9 and 27.

18. The method of claim 11, further comprising:
repeating the deposition cycle one or more cycles, and after the step of repeating,
performing an oxygen plasma treatment step.

19. The method of claim 18, wherein a number of deposition cycles is larger than a number of oxygen plasma treatment steps.

* * * * *